United States Patent [19]

Gloton et al.

[11] Patent Number: 4,810,865
[45] Date of Patent: Mar. 7, 1989

[54] METHOD FOR RECYCLING A CARD HAVING AN INCORPORATED COMPONENT, AND A CARD DESIGNED TO PERMIT RECYCLING

[75] Inventors: Jean P. Gloton, Aix en Provence; Philippe Peres, Gardanne, both of France

[73] Assignee: Eurotechnique, Rousset, France

[21] Appl. No.: 927,060

[22] Filed: Nov. 5, 1986

[30] Foreign Application Priority Data

Nov. 8, 1985 [FR] France .................. 85 16604

[51] Int. Cl.⁴ ............................................. G06K 19/00
[52] U.S. Cl. ..................................... 235/487; 235/492
[58] Field of Search ............. 235/380, 487, 488, 491, 235/492; 283/83; 357/79, 80

[56] References Cited

U.S. PATENT DOCUMENTS

| | | | |
|---|---|---|---|
| 3,440,027 | 4/1969 | Hugle | 174/52 PE X |
| 3,611,061 | 10/1971 | Segerson | 174/52 PE X |
| 4,065,625 | 12/1977 | Iwai et al. | 174/52 FP X |
| 4,396,457 | 8/1983 | Bakermans | 357/70 X |
| 4,442,345 | 4/1984 | Mollier | |
| 4,480,150 | 10/1984 | Jones et al. | 174/52 FP |
| 4,536,825 | 8/1985 | Soerewyn | 361/412 X |
| 4,567,545 | 1/1986 | Mettler | 174/52 FP X |
| 4,614,144 | 9/1986 | Sagar | 235/492 |
| 4,621,278 | 11/1986 | Miura | 357/70 |
| 4,649,415 | 3/1987 | Herbert | 357/70 X |

FOREIGN PATENT DOCUMENTS

| | | |
|---|---|---|
| 0095391 | 11/1983 | European Pat. Off. . |
| 0121268 | 10/1984 | European Pat. Off. . |
| 2363833 | 7/1974 | Fed. Rep. of Germany . |
| 2810054 | 8/1978 | Fed. Rep. of Germany . |
| 2216750 | 8/1974 | France . |
| 2213599 | 8/1974 | France . |
| 2337381 | 7/1977 | France . |
| 2439438 | 5/1980 | France . |
| 2483128 | 11/1981 | France . |
| 60589 | 6/1983 | Japan . |
| 2073947 | 10/1981 | United Kingdom . |
| 2149209 | 6/1985 | United Kingdom . |

OTHER PUBLICATIONS

William L. C. Hui, Integration Techniques for Electronically Active Elements and Circuits, RCA Tech. Notes, RCA TN#711, Jun. 1967.
Patents Abstracts of Japan, vol. 9, No. 113 (P-356)[1836], 17 mai 1985; and JP-A-60 589 (Kiyoudou Insatsu K.K.) 05.01.1985 * Abrege *.
Patents Abstracts of Japan, vol. 8, No. 139 (E253)[1576] Jun. 28, 1984; and JP-A-59-47-478 (Hitachi Seisakusho K.K.).

*Primary Examiner*—A. D. Pellinen
*Assistant Examiner*—Leon K. Fuller
*Attorney, Agent, or Firm*—Oblon, Fisher, Spivak, McClelland & Maier

[57] ABSTRACT

An electronic card which can be reused a large number of times incorporates a semiconductor circuit provided with an area which is erasable by means of electromagnetic radiation within the ultraviolet range of wavelengths. The externally-emitted ultraviolet radiation applied to the semiconductor circuit via a card recess passes through a quartz window and impinges on the erasable area.

3 Claims, 1 Drawing Sheet

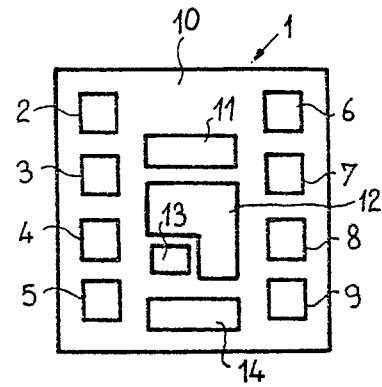
FIG_1
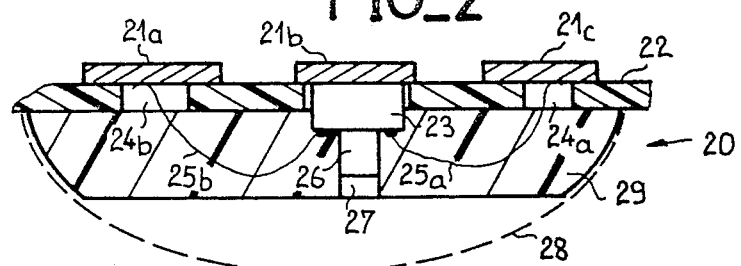
FIG_2
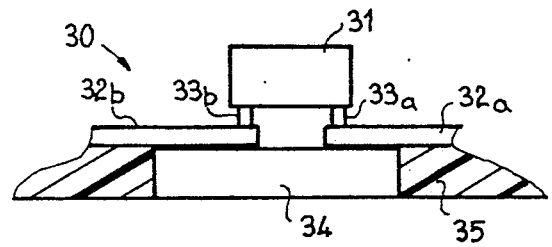
FIG_3
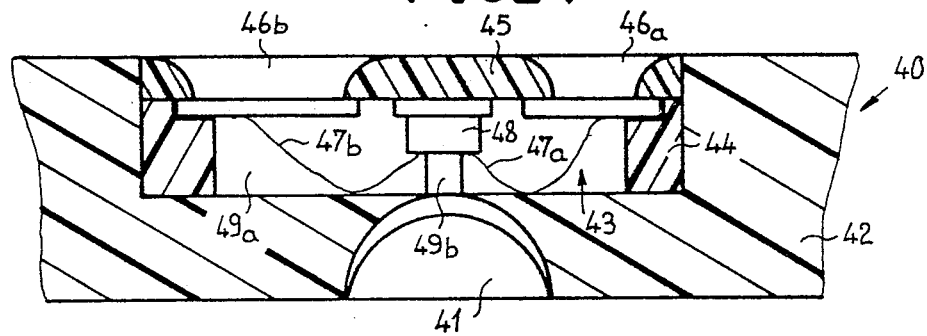
FIG_4

METHOD FOR RECYCLING A CARD HAVING AN INCORPORATED COMPONENT, AND A CARD DESIGNED TO PERMIT RECYCLING

BACKGROUND OF THE INVENTION

1. Field of the Invention

The present invention is concerned with a method for recycling a card having an incorporated component and is also concerned with a card designed to permit recycling. The invention finds an application both in the field of manufacture of memory cards and in the field of electronic funds transfer or payment systems as well as the field of safety systems.

2. Description of the Prior Art

A card of the CCC type known in the prior art usually incorporates a microprocessor which is implanted into a semiconductor. The microprocessor is provided with a semiconductor memory device which is permanent and does not permit reuse of the card after its period of service.

The invention proposes a simple method for reusing the card after this latter has been withdrawn from service and thus permits an economy in the use of CCC cards.

SUMMARY OF THE INVENTION

The present invention in fact relates to a method for recycling a card which incorporates an electronic component of the semiconductor type. The invention essentially consists in introducing the CCC card into an erasing device which transmits a signal for erasing at least one reusable portion of the component.

The invention is also concerned with a card incorporating an electronic component of the semiconductor type mounted in a micromodule which carries electrical connections and protects the component.

The distinctive features of a card of this type lies in the fact that the semiconductor has an area which is erasable by electromagnetic radiation of predetermined wavelength.

The description given hereinafter will relate to the use of a memory area which is erasable by radiation. It will be understood, however, that other means which make use of a given erasure signal may also be contemplated. In particular, it is possible to depolarize a predetermined memory area, for example, by transmitting a signal to the CCC card.

The use of electromagnetic radiation is subject to the need to maintain the card in normal use. Stated differently, the electromagnetic radiation must be selected from a particular range of wavelengths outside the spurious radiations usually distributed in the atmosphere.

BRIEF DESCRIPTION OF THE DRAWINGS

FIG. 1 is a specific diagram of a semiconductor for use in a CCC card.

FIG. 2 illustrates a first embodiment of a micromodule employed for insertion in a CCC card in accordance with the invention.

FIG. 3 illustrates a second embodiment of a micromodule employed for insertion in a CCC card in accordance with the invention.

FIG. 4 illustrates an embodiment of a CCC card in accordance with the invention.

DESCRIPTION OF THE PREFERRED EMBODIMENTS

In FIG. 1, there is shown the top face of a semiconductor 1 arranged as a microprocessor having contact pads 2-9 to which connecting leads will be attached as hereinafter explained in detail. Areas 11-14 for performing different electronic functions are formed on the surface of the silicon by means of known processes. In particular, the area 11 can consist of a data register, the area 12 can consist of a data memory, the area 13 can consist of an arithmetic and logic unit and the area 14 can consist of addressing means. These different units are interconnected by wiring channels (not shown in the drawings).

The present invention makes use of a memory area 12 which is erasable by means of radiation within the ultraviolet range of wavelengths, for instance. Known memories of this type are designated as ultraviolet-EPROM devices and contain data which are initially recorded and then erased at will by means of ultraviolet radiation.

FIG. 2 illustrates a portion of a card in accordance with the invention. The card 29 incorporates a micromodule 20 consisting of a plastic base 22, the top external face of said base as shown in the figure being adapted to carry metal contact areas 21a, 21b, 21c which are connected to an external reader. The underface of the base 22 is adapted to carry a semiconductor circuit 23 of the type shown in FIG. 1. The leads 25a and 25b connect the contact pads of the type shown in FIG. 1 to the lateral contact areas 21a, 21c. The entire surface of the substrate of the semiconductor 23 is connected to the central contact area 21b. In addition, a bead 28 of protective resin is deposited on the underface of the base 22. The resin makes it possible to ensure that the base wiring and circuit wiring array is endowed with mechanical cohesion and held in place while at the same time ensuring that the semiconductor circuit is protected against outside agents. The leads 25a and 25b penetrate to the bottom faces of the contact areas 21a, 21c via holes 24a, 24b of the base 22. In the method of fabrication of a micromodule of this type, the bottom portion of the bead 28 is ground so that only the portion 29 of the bead which is bounded by a full line is permitted to remain. The micromodule 20 is then fitted in position on a CCC card.

In one embodiment of the invention, a drilling operation is then performed in order to deposit a quartz plate 27 on a spacer 26. The quartz plate serves to form an interface between the exterior of the card and the interior of the micromodule. The ultraviolet rays pass through the quartz plate which is placed on the spacer 26 and reach the area which is erasable by ultraviolet radiation, or so-called UV-erasable area.

In another embodiment (not shown in the drawings), the quartz plate is placed on a layer of adhesive directly on the semiconductor crystal. The structure thus formed is encapsulated in the resin which is then ground so as to expose the quartz window.

In the alternative form of construction illustrated in FIG. 3, the semiconductor circuit 31 is shown in the same position as in FIG. 2. The contact pads 33a and 33b are connected to beam leads 32a, 32b. Said beam leads are therefore made integral with the semiconductor circuit and also with a plastic base 35. Said base is pierced by a bore 34 opposite to the semiconductor circuit 31. Within said bore, a quartz plate which is transparent to ultraviolet radiation is mounted on the beam leads 32a and 32b.

In FIG. 4, there is shown a CCC card constructed in accordance with the invention. The card assembly 40 comprises a portion 42 having a credit-card format and formed of plastic material. This card 42 of credit-card size is provided with two bores or recesses, namely a recess 41 in the bottom face of the card and a recess 43 in the top face. The recess 43 is designed to accommodate a micromodule, for example of the type shown either in FIG. 2 or in FIG. 3, or else of the type shown in FIG. 4 in which the micromodule has been fitted in position within the recess 43 of the top face of the card 42.

A micromodule of this type is provided with a plastic base 45 and with metal contact areas deposited on the undersurface of the base. These contact areas are similar to the areas 21a, 21b, 21c shown in FIG. 2 but are deposited on the opposite face of the plastic base. The leads 47a and 47b connect the semiconductor circuit 48 directly without passing through holes. One advantage of the arrangement under consideration lies in the fact that the metal contact areas are substantially protected against the external environment. It is necessary to ensure, however, that the base 45 is provided with bores 46a and 46b opposite to the contact areas in order to permit access to these latter by the reading device contacts.

Within the recess 43, the micromodule is also provided with a plastic guard ring 44 which surrounds the micromodule and serves on the one hand to contain the resin 49 to be levelled down during the fabrication process and on the other hand to ensure that the micromodule has a substantially cylindrical or parallelepipedal shape as the case may be. A quartz plate 49b serves to form the interface between the UV-erasable area of circuit 48 and the exterior. The recess 41 is intended to accommodate an optical device for focusing the beam of ultraviolet radiation and also serves to facilitate transmission of the radiant energy flux supplied for the erasing operation.

The gel which serves as spacer material between the quartz plate and the area to be erased also serves as an adhesive for bonding the transparent plate to the micromodule.

What is claimed is:

1. A card incorporating an electronic component of the semiconductor type mounted in a micromodule, said micromodule being adapted to carry electrical connections and to protect the semiconductor component, wherein an area of said semiconductor component is erasable by means of electromagnetic radiation of predetermined wavelength;

a plate which is transparent to the erasing radiation being placed above the area to be erased within the micromodule, said plate being placed on a spacer gel, said plate being adhesively bonded to the semiconductor component by means of said gel.

2. A card according to claim 1, wherein the micromodule is provided with a guard ring and the radiation-transparent plate is placed on the free face of said guard ring.

3. A card according to claim 1, wherein the micromodule is provided with beam leads implanted in the semiconductor component surface by means of contact pads and in a plastic base provided with a recess located opposite to the semiconductor component, the radiation-transparent plate aforesaid being placed within said recess.

* * * * *